United States Patent
Lin et al.

(10) Patent No.: US 7,560,728 B2
(45) Date of Patent: Jul. 14, 2009

(54) VERTICAL ORGANIC TRANSISTOR AND METHOD OF FABRICATING THE SAME

(75) Inventors: Shih-Yen Lin, Hsinchu (TW); Tzu-Min Ou, Taipei (TW); Chuan-Yi Yang, Chiayi County (TW); Shu-Ting Chou, Taipei County (TW); Chun-Yuan Huang, Changhua County (TW); I-Min Chan, Taoyuan County (TW); Shiau-Shin Cheng, Pingtung County (TW); Yi-Jen Chan, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 435 days.

(21) Appl. No.: 11/308,716

(22) Filed: Apr. 25, 2006

(65) Prior Publication Data

US 2007/0176166 A1    Aug. 2, 2007

(30) Foreign Application Priority Data

Jan. 27, 2006    (TW) .............................. 95103384 A

(51) Int. Cl.
*H01L 29/08*    (2006.01)

(52) U.S. Cl. ................... 257/40; 438/99; 257/E51.003; 257/E51.011

(58) Field of Classification Search ................... 257/40, 257/E51.003, E51.011; 438/99
See application file for complete search history.

(56) References Cited

U.S. PATENT DOCUMENTS

2005/0186446 A1*    8/2005    Shitagaki et al. ............ 428/690

OTHER PUBLICATIONS

Kudo et al., "Schottky gate static induction transistor using copper phthalocyanine films" Thin Solid Films, vol. 331, No. 1, Oct. 15, 1998, pp. 51-54(4), Elsevier Science.

(Continued)

*Primary Examiner*—Kiesha L Rose
*Assistant Examiner*—Tucker Wright
(74) *Attorney, Agent, or Firm*—Jianq Chyun IP Office

(57) ABSTRACT

A vertical organic transistor is disclosed, which includes at least: a collector contact layer disposed on a substrate; a first organic semiconductor layer disposed on the collector contact layer; a base contact layer disposed on the first organic semiconductor layer, wherein the base contact layer comprises no less than two layers of hetero-metal layers or hetero-conductive organic layers; a second organic semiconductor layer disposed on the base contact layer; and an emitter contact layer disposed on the second organic semiconductor layer. Device properties such as output current and $I_{on}/I_{off}$ rate can be improved by using the vertical organic transistor of this invention.

9 Claims, 4 Drawing Sheets

OTHER PUBLICATIONS

Wang et al., "Device Characteristics of Organic Static Induction Transistor Using Copper Phthalocyanine Films and Al Gate Electrode" Jpn. J. Appl. Phys. vol. 38(1999) 256-259, Part 1, No. 1A, Jan. 15, 1999.

Tanaka et al., "Vertical- and lateral-type organic FET using pentacene evaporated films" Electrical Engineering in Japan vol. 149, Issue 2, pp. 43-48, Published Online: Aug. 5, 2004, Wiley Periodicals, Inc.

Ma et al., "Unique architecture and concept for high-performance organic transistors" Applied Physics Letters, vol. 85, No. 21, American Institute of Physics, Nov. 22, 2004.

Mahapatro, et al. "Schottky energy barrier and charge injection in metal/copper-phthalocyanine/metal structures" Applied Physics Letters, vol. 80, Issue 25, pp. 4840-4842, Jun. 24, 2002.

* cited by examiner

VERTICAL ORGANIC TRANSISTOR AND METHOD OF FABRICATING THE SAME

CROSS-REFERENCE TO RELATED APPLICATION

This application claims the priority benefit of Taiwan application serial no. 95103384, filed on Jan. 27, 2006. All disclosure of the Taiwan application is incorporated herein by reference.

BACKGROUND OF THE INVENTION

1. Field of Invention

The present invention relates to a vertical organic transistor and a method of fabricating the same. More particularly, the present invention relates to a vertical organic transistor having a base contact layer made of no less than two hetero materials and a method of fabricating the same.

2. Description of Related Art

Compared with conventional inorganic electronic devices (Si- and GaAs- based electronic devices), the most striking feature of organic electronic devices is low dependency on the substrate. That is, an organic electronic device can be fabricated on a flexible substrate and applied in fabricating a flexible flat panel display. And a low-priced printing technique can be used in fabricating organic electronic devices, and they have the characteristic of being able to be fabricated at a low temperature (<200° C.). Therefore, organic electronic devices are currently directly applied in flexible flat panel displays of large area and low unit price. However, since organic electronic devices have bottlenecks in device properties, even flat panel displays will generally experience problems of low resolution and frame rate, let alone the application of organic transistor devices that operate at Mega Hertz (MHz) and above.

The main technical bottlenecks of the device properties of organic electronic devices are as follows.

1. The mobility of the organic semiconductor serving as a transistor channel is too low. Since the electronic conduction in the organic semiconductor material achieves the object of conducting current by hopping among empty delocalized molecular orbitals between organic molecules under an applied electric field, compared with the high mobility caused by the electrons in the inorganic semiconductor accelerating among periodical potentials, the mobility of the organic semiconductor material is naturally lower than that of Si, GaAs, and so on. Additionally, because (a) most organic semiconductors have characteristics similar to those of the P type semiconductor and (b) the grain boundary of the organic transistor blocks the electronic conduction mechanism, currently the highest hole mobility is about 1 $cm^2V^{-1}s^{-1}$. And although the HOMO (highest-occupied molecular orbital) and LUMO (lowest-unoccupied molecular orbital) of the organic semiconductor are similar to the valence band and conductive band of the semiconductor, since the HOMO and LUMO are still in the stage of molecular orbital (MO), the level density thereof is still much lower than that of a common semiconductor. Therefore, most attempts to fabricate an N type organic semiconductor have achieved no breakthrough.

2. It is too difficult to be integrated into a mature fabricating process. Since most organic semiconductor materials can easily reacted with chemicals commonly used in the semiconductor industry and changed, conventional fabrication methods cannot be adopted in preparing such organic semiconductor materials. And after this fabricating process, further fabricating processes for enhancing device properties can not be performed. Therefore, most research of organic transistors is currently limited to simple bottom gate/source/drain contact layer/organic semiconductors or a bottom gate/organic semiconductor/source/drain contact layer structure. Thus, not only are the device properties limited, but the research of complex hetero structures is also held back.

In view of the above, a vertical organic transistor having the vertical structure is provided. However, because it is difficult to hold the material properties of the vertical organic transistor, device properties such as the output current and $I_{on}/I_{off}$ rate of the transistor are not good enough.

SUMMARY OF THE INVENTION

Accordingly, the object of the present invention is to provide a vertical organic transistor and the method of fabricating the same, suitable for enhancing the output current and the $I_{on}/I_{off}$ rate of the vertical transistor.

A vertical organic transistor is provided by the present invention, which at least comprises a collector contact layer disposed on a substrate, wherein the collector contact layer comprises a metal layer or a conductive organic layer; a first organic semiconductor layer disposed on the collector contact layer; a base contact layer disposed on the first organic semiconductor layer, wherein the base contact layer comprises no less than two layers of hetero-metal layers or hetero-conductive organic layers; a second organic semiconductor layer disposed on the base contact layer; and an emitter contact layer disposed on the second organic semiconductor layer, wherein the emitter contact layer comprises a metal layer or a conductive organic layer.

The present invention provides a method of fabricating the vertical organic transistor. A collector contact layer is formed on a substrate, wherein the collector contact layer comprises a metal layer or a conductive organic layer. Then, a first organic semiconductor layer is formed on the collector contact layer. A base contact layer is formed on the first organic semiconductor layer, wherein the base contact layer comprises no less than two layers of hetero-metal layers or hetero-conductive organic layers. Then, a second organic semiconductor layer is formed on the base contact layer. And an emitter contact layer is formed on the second organic semiconductor layer, wherein the emitter contact layer comprises a metal layer or a conductive organic layer.

According to the method of fabricating the vertical transistor, the process for forming the collector contact layer, the first organic semiconductor layer, the base contact layer, the second organic semiconductor layer, and the emitter contact layer comprises vacuum deposition, ink jet, screen printed method or spin-coating.

According to the vertical organic transistor and the method of fabricating the same, the base contact layer comprises a stacked layer of an aluminum metal layer and a gold metal layer.

According to the vertical organic transistor and the method of fabricating the same, the collector contact layer comprises a gold metal layer.

According to the vertical organic transistor and the method of fabricating the same, the emitter contact layer comprises a gold metal layer.

According to the vertical organic transistor and the method of fabricating the same, the conductivity types of the first organic semiconductor layer and the second organic semiconductor layer are simultaneously P type or N type.

According to the vertical organic transistor and the method of fabricating the same, the material of the first organic semiconductor layer and the second organic semiconductor layer comprises copper phthalocyanine (CuPc).

As can be seen from the above, since the vertical organic transistor of the present invention adopts a base contact layer made of no less than two hetero materials, the output current and the $I_{on}/I_{off}$ rate of the vertical organic transistor can be enhanced, thereby improving the device properties of the vertical organic transistor.

In order to the make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

DESCRIPTION OF EMBODIMENTS

Figure 1:
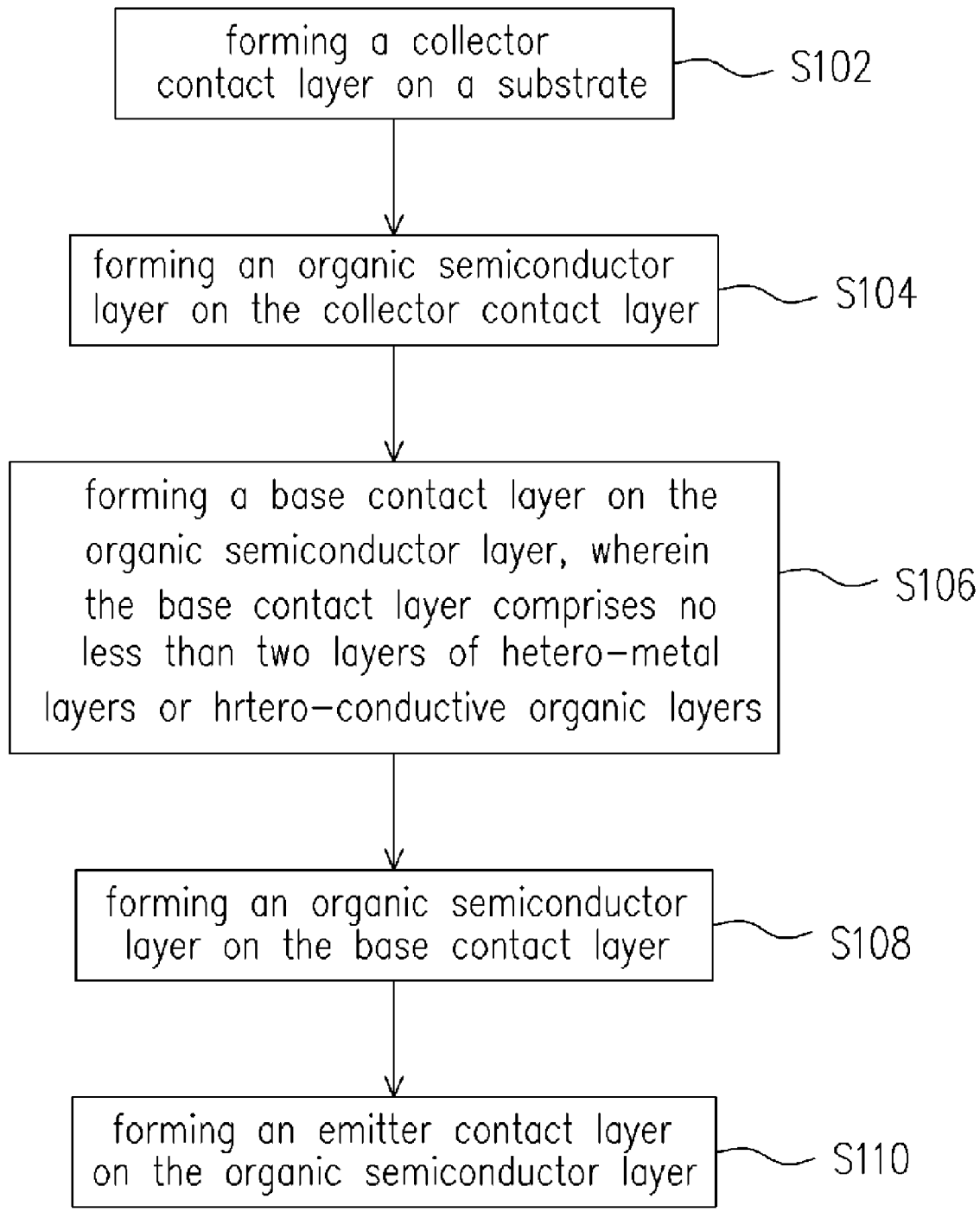
FIG. 1 is a flowchart of fabricating a vertical organic transistor of the preferred embodiment of the present invention.

FIG. 1 is a flowchart of fabricating a vertical organic transistor of the preferred embodiment of the present invention. And FIG. 2 is a schematic cross-sectional view of a vertical organic transistor of the preferred embodiment of the present invention.

Figure 2:
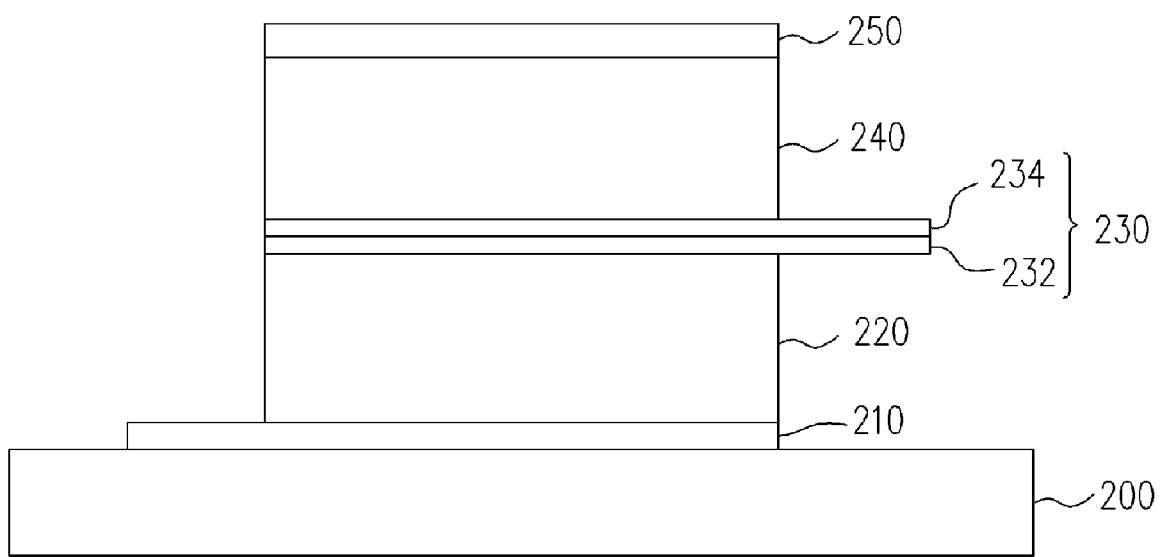
FIG. 2 is a schematic cross-sectional view of a vertical organic transistor of the preferred embodiment of the present invention.

First, referring to step S102 of FIG. 1 and FIG. 2, a collector contact layer 210 is formed on a substrate 200. The method of forming the collector contact layer 210 involves, for example, using a metal shadow mask with a desired pattern to form the collector contact layer 210 on the substrate 200 by vacuum deposition, ink jet, screen printed method, spin-coating, or the like. And the substrate 200 is, for example, a glass substrate, a plastic substrate, or a flexible substrate. The collector contact layer 210 is, for example, a metal layer or a conductive organic layer. In the present embodiment, the collector contact layer 210 is, for example, a gold metal layer with a thickness of 10 nm.

Then, referring to step S104 of FIG. 1 and FIG. 2, an organic semiconductor layer 220 is formed on the collector contact layer 210. The method of forming the organic semiconductor layer 220 involves, for example, using a metal shadow mask with a desired pattern to form the organic semiconductor layer 220 on the collector contact layer 210 by, for example, vacuum deposition, ink jet, screen printed method, spin-coating, or the like. And the conductivity type of the organic semiconductor layer 220 is, for example, P type or N type with a thickness of 5 to 50 nm. In the present embodiment, the organic semiconductor layer 220 is, for example, copper phthalocyanine with a thickness of 10 nm.

Then, referring to step S106 of FIG. 1 and FIG. 2, a base contact layer 230 is formed on the organic semiconductor layer 220. The base contact layer 230 comprises no less than two layers of hetero-metal layers or hetero-conductive organic layers. The method of forming the base contact layer 230 involves, for example, respectively using a metal shadow mask with the desired pattern for the hetero film layers of the base contact layer 230 and stacking the hetero film layers to form the base contact layer 230 by, for example, vacuum deposition, ink jet, screen printed method, spin-coating, or the like. And the thickness of each layer of the base contact layer 230 is, for example, 1 to 10 nm, respectively. In the present embodiment, the base contact layer 230 comprises, for example, a first material layer 232 and a second material layer 234. The first material layer 232 is, for example, an aluminum metal layer and the second material layer 234, is for example, a gold metal layer. And the thicknesses of each of the first material layer 232 and second material layer 234 is, for example, 5 nm, respectively.

Then, referring to step S108 of FIG. 1 and FIG. 2, an organic semiconductor layer 240 is formed on the base contact layer 230. The method of forming the organic semiconductor layer 240 involving, for example, using a metal shadow mask with the desired pattern to form the organic semiconductor layer 240 on the base contact layer 230 by, for example, vacuum deposition, ink jet, screen printed method, spin-coating, or the like. And the conductivity type of organic semiconductor 240 is, for example, the same as that of organic semiconductor layer 220 (being P type or N type). And the thickness of organic semiconductor 240 is 5 to 50 nm. In the present embodiment, the organic semiconductor layer 240 is, for example, copper phthalocyanine with a thickness of 10 nm.

Then, referring to step S110 of FIG. 1 and FIG. 2, an emitter contact layer 250 is formed on the organic semiconductor layer 240. The method of forming the emitter contact layer 250 involves, for example, using a metal shadow mask with the desired pattern to form the emitter contact layer 250 on the organic semiconductor layer 240 by, for example, vacuum deposition, ink jet, screen printed method, spin-coating, or the like. And the emitter contact layer 250 comprises, for example, a metal layer or a conductive organic layer. In the present embodiment, the emitter contact layer 250 is, for example, a gold metal layer with a thickness of 10 nm.

In the cross sectional structure of the vertical organic transistor as shown in FIG. 2, the reason why the collector contact layer 210 and the base contact layer 230 extend outwardly is for the succession of electrical property when measuring. However, the present invention is not limited to this. The collector contact layer 210, the organic semiconductor layers 220, 240, the base contact layer 230, and the emitter contact layer 250 of the present invention can be respectively formed into any appropriate shape according to practical needs.

In order to compare the vertical organic transistor of the present invention employing a hetero composite material as the base contact layer with the conventional vertical organic transistor employing a single material as the base contact layer, the aluminum/gold base contact layer with a thickness of 5 nm/5 nm of the above embodiment was replaced by an aluminum metal base contact layer with a thickness of 10 nm, to fabricate a conventional vertical organic transistor employing a single material as the base contact layer. Then, the conventional vertical organic transistor and the vertical organic transistor of the present invention were tested, and the results are shown in FIG. 3A to FIG. 4B.

Figure 3A:
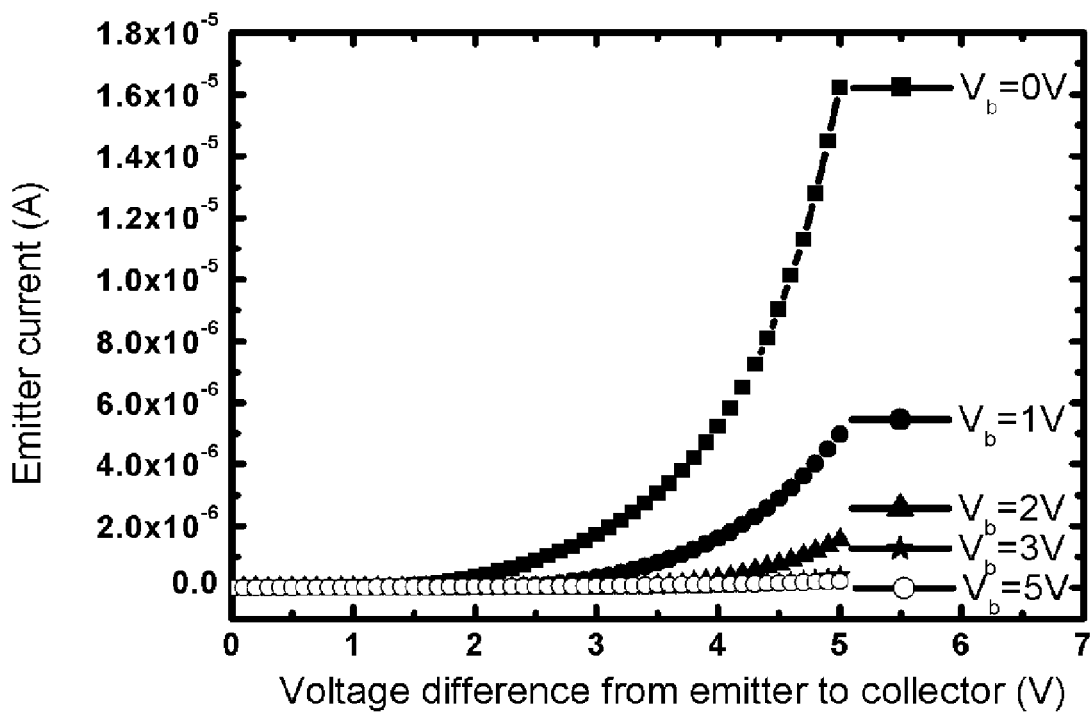
FIG. 3A is a schematic view of the voltage difference from the emitter to the collector versus the emitter current of the conventional vertical organic transistor using a single material as the base contact layer.
Figure 3B:
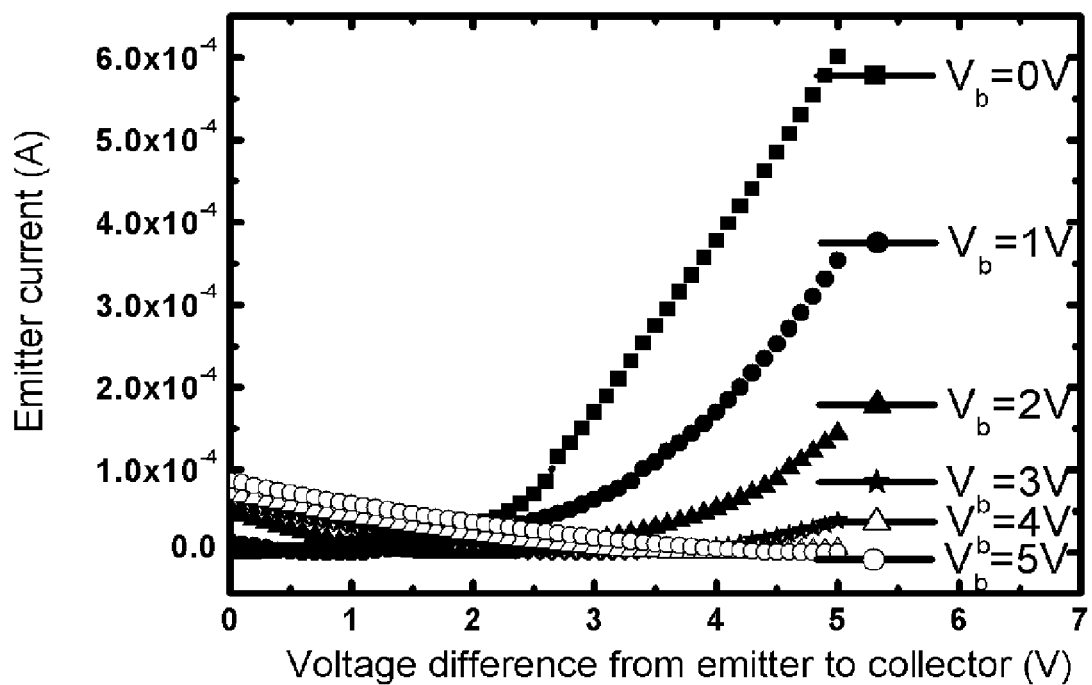
FIG. 3B is a schematic view of the voltage difference from the emitter to the collector versus the emitter current of the vertical organic transistor of the present invention using a hetero-metal composite material as the base contact layer.

FIG. 3A is a schematic view of the voltage difference from the emitter to the collector versus the emitter current of the conventional vertical organic transistor using a single material as the base contact layer. FIG. 3B is a schematic view of the voltage difference from the emitter to the collector versus the emitter current of the vertical organic transistor of the present invention using a hetero-metal composite material as the base contact layer. As shown in FIG. 3B, when the base voltage ($V_B$) is 0 V and the voltage difference from the emitter to the collector ($V_{EC}$) is 5 V, the output current of the vertical organic transistor of the present invention employing the hetero composite material as the base contact layer is $6 \times 10^{-4}$ A, which is much greater than that of the conventional vertical organic transistor employing a single material as the base (being $1.7 \times 10^{-5}$ A at the same measuring situation). And after measuring, when $V_B$ is 0 V and $V_{EC}$ is 5 V, the $I_{on}/I_{off}$ rate of the vertical organic transistor of the present invention can reach $10^4$, and $I_{on}/I_{off}$ rate of the conventional vertical organic transistor is $10^3$. Therefore, it can be known that the vertical organic transistor having the base contact layer made of no less than two hetero materials can achieve high output current and a high $I_{on}/I_{off}$ rate.

Figure 4A:
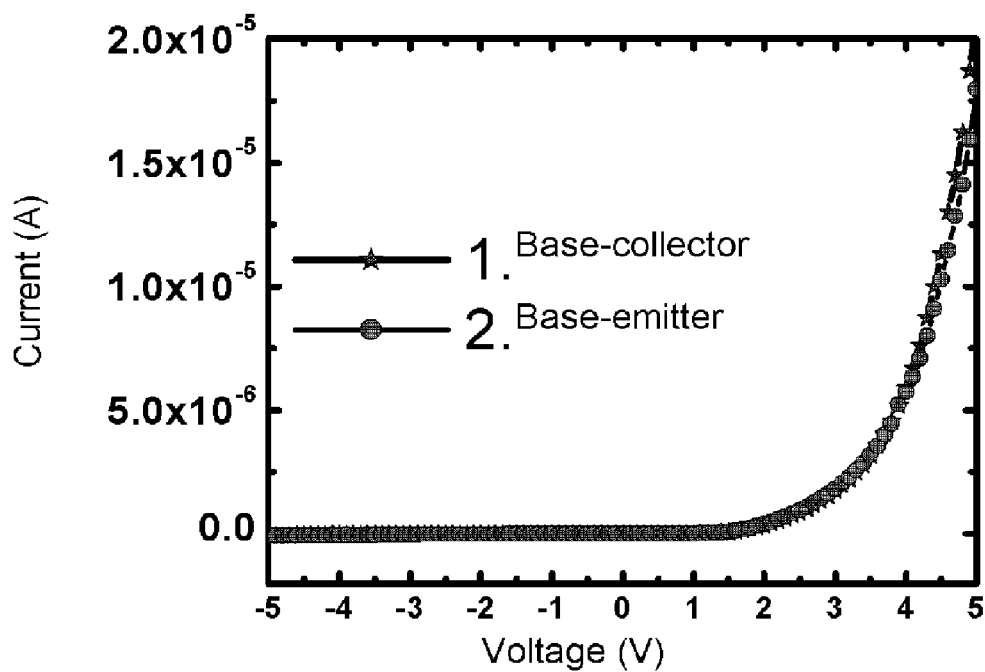
FIG. 4A is a schematic view of the voltage versus the current of the base-collector and base-emitter of the conventional vertical organic transistor using a single material as the base contact layer.
Figure 4B:
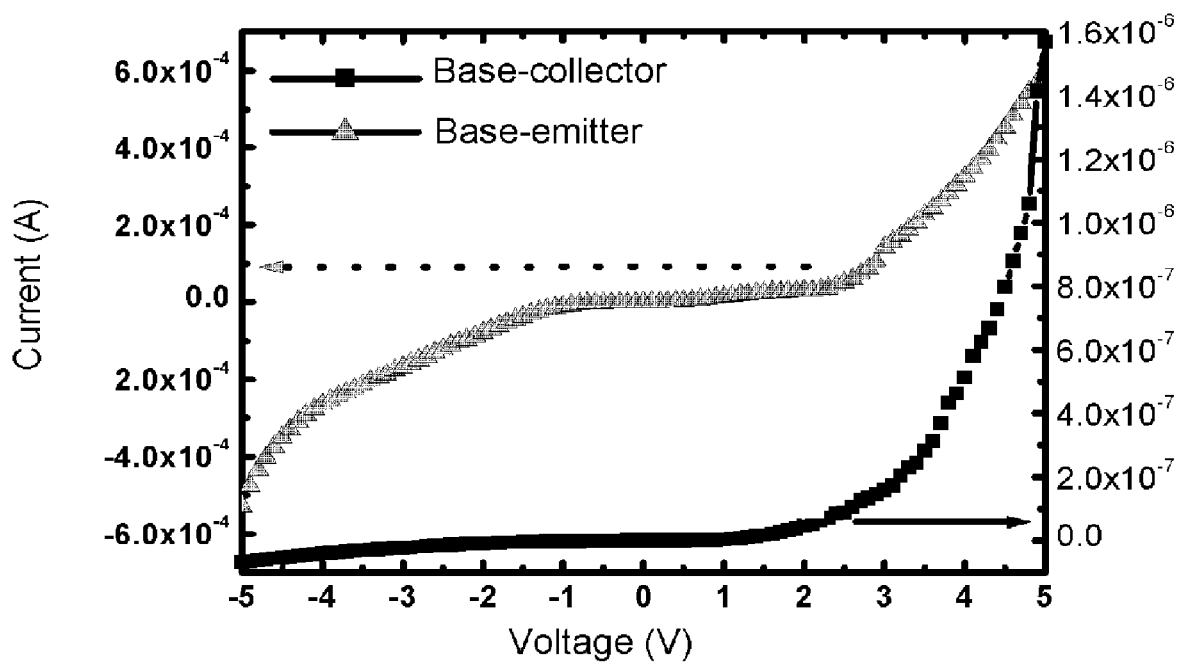
FIG. 4B is a schematic view of the voltage versus the current of the base-collector and base-emitter of the vertical organic transistor of the present invention using a hetero-metal composite material as the base contact layer.

FIG. 4A is a schematic view of the voltage versus the current of the base-collector and base-emitter of the conventional vertical organic transistor using a single material (aluminum) as the base contact layer. FIG. 4B is a schematic view of the voltage versus the current of the base-collector and base-emitter of the vertical organic transistor of the present invention using a hetero-metal composite material (aluminum/gold) as the base contact layer. The operating mechanism of the vertical organic transistor can be known from the current-voltage characteristic of the base-collector and base-emitter of FIG. 4A and FIG. 4B. As shown in FIG. 4A, since the boundary between the base and the organic semiconductor (CuPc) of the conventional vertical organic transistor employing a single material (aluminum) as the base contact layer is a symmetric Schottky boundary, the injection of the emitter electron hole is limited. Oppositely, as shown in FIG. 4B, since the base-emitter terminal of the vertical organic transistor of the present invention using the hetero composite material (aluminum/gold) as the base contact layer is a quasi-Ohmic boundary, the barrier height of the boundary can be adjusted to within an extremely short distance (<100 nm). The emitter current will rise greatly, so as to enhance the output current and the $I_{on}/I_{off}$ rate and improve the device properties.

To sum up, the vertical organic transistor and the method of fabricating the same of the present invention has at least the following advantages.

Since the vertical organic transistor of the present invention adopts a base contact layer made of no less than two hetero materials, the output current and the $I_{on}/I_{off}$ rate of the vertical organic transistor can be enhanced, so as to improve the device properties of the vertical organic transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A vertical organic transistor, comprising at least:
    a collector contact layer, disposed on a substrate, wherein the collector contact layer comprises a metal layer or a conductive organic layer;
    a first organic semiconductor layer, disposed on the collector contact layer;
    a base contact layer, disposed on the first organic semiconductor layer, wherein the base contact layer comprises a stacked layer of an aluminum metal layer and a gold metal layer;
    a second organic semiconductor layer, disposed on the base contact layer, wherein the conductivity types of the first organic semiconductor layer and the second organic semiconductor layer are P type or N type; and
    an emitter contact layer, disposed on the second organic semiconductor layer, wherein the emitter contact layer comprises a metal layer or a conductive organic layer.

2. The vertical organic transistor as claimed in claim 1, wherein the collector contact layer comprises a gold metal layer.

3. The vertical organic transistor as claimed in claim 1, wherein the emitter contact layer comprises a gold metal layer.

4. The vertical organic transistor as claimed in claim 1, wherein the material of the first organic semiconductor layer and the second organic semiconductor layer include copper phthalocyanine (CuPc).

5. A method of fabricating the vertical organic transistor, comprising at least:
    forming a collector contact layer on a substrate, wherein the collector contact layer comprises a metal layer or a conductive organic layer;
    forming a first organic semiconductor layer on the collector contact layer;
    forming a base contact layer on the first organic semiconductor layer, wherein the base contact layer comprises a stacked layer of an aluminum metal layer and a gold metal layer;
    forming a second organic semiconductor layer on the base contact layer, wherein the conductivity types of the first organic semiconductor layer and the second organic semiconductor layer are P type or N type; and
    forming an emitter contact layer on the second organic semiconductor layer, wherein the emitter contact layer comprises a metal layer or a conductive organic layer.

6. The method of fabricating the vertical transistor as claimed in claim 5, wherein the process for forming the collector contact layer, the first organic semiconductor layer, the base contact layer, the second organic semiconductor layer, the emitter contact layer is vacuum deposition, ink jet, screen printed method, or spin-coating.

7. The method of fabricating the vertical transistor as claimed in claim 5, wherein the collector contact layer comprises a gold metal layer.

8. The method of fabricating the vertical transistor as claimed in claim 5, wherein the emitter contact layer comprises a gold metal layer.

9. The method of fabricating the vertical transistor as claimed in claim 5, wherein the material of the first organic semiconductor layer and the second organic semiconductor layer comprises copper phthalocyanine (CuPc).

* * * * *